United States Patent
Nakagawa et al.

(10) Patent No.: US 11,335,554 B2
(45) Date of Patent: May 17, 2022

(54) METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventors: Takashi Nakagawa, Toyama (JP); Takayuki Waseda, Toyama (JP); Kimihiko Nakatani, Toyama (JP); Motomu Degai, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/817,541

(22) Filed: Mar. 12, 2020

(65) Prior Publication Data

US 2020/0303185 A1    Sep. 24, 2020

(30) Foreign Application Priority Data

Mar. 20, 2019 (JP) ............... JP2019-053281

(51) Int. Cl.
*H01L 21/02* (2006.01)

(52) U.S. Cl.
CPC .... *H01L 21/02312* (2013.01); *H01L 21/0217* (2013.01); *H01L 21/02164* (2013.01); *H01L 21/02271* (2013.01)

(58) Field of Classification Search
None
See application file for complete search history.

(56) References Cited

U.S. PATENT DOCUMENTS

| | | |
|---|---|---|
| 5,864,161 A | 1/1999 | Mitani et al. |
| 6,342,421 B1 | 1/2002 | Mitani et al. |
| 2017/0221699 A1 | 8/2017 | Orihashi et al. |
| 2017/0278705 A1 | 9/2017 | Murakami et al. |
| 2018/0010247 A1 | 1/2018 | Niskanen et al. |
| 2018/0204716 A1 | 7/2018 | Takahashi et al. |
| 2018/0315840 A1 | 11/2018 | Chui et al. |
| 2019/0080936 A1 | 3/2019 | Ozaki |

(Continued)

FOREIGN PATENT DOCUMENTS

| | | |
|---|---|---|
| CN | 109473338 A | 3/2019 |
| JP | 08-153688 A | 6/1996 |

(Continued)

OTHER PUBLICATIONS

Korean Office Action dated Feb. 3, 2021 for Korean Patent Application No. 10-2020-0030173.

(Continued)

*Primary Examiner* — Asok K Sarkar
(74) *Attorney, Agent, or Firm* — Volpe Koenig

(57) ABSTRACT

There is provided a technique that includes: (a) modifying a surface of one base among a first base and a second base to be F-terminated by supplying a fluorine-containing radical generated from a fluorine-containing gas to a substrate where the first base and the second base are exposed at a surface of the substrate; and (b) forming a film on a surface of the other base, which is different from the one base, among the first base and the second base by supplying a film-forming gas to the substrate after modifying the surface of the one base.

18 Claims, 8 Drawing Sheets

(56) References Cited

U.S. PATENT DOCUMENTS

2019/0341476 A1   11/2019  Chui et al.
2020/0224311 A1    7/2020  Niskanen et al.
2020/0357636 A1* 11/2020  Abel ................ H01L 21/67167

FOREIGN PATENT DOCUMENTS

| | | |
|---|---|---|
| JP | 2013-243193 A | 12/2013 |
| JP | 2017-135344 A | 8/2017 |
| JP | 2017-174919 A | 9/2017 |
| KR | 2018-0006332 A | 1/2018 |
| KR | 2018-0085358 A | 7/2018 |
| KR | 2018-0120062 A | 11/2018 |

OTHER PUBLICATIONS

Japanese Office Action dated Mar. 2, 2021 for Japanese Patent Application No. 2019-053281.
Chinese Office Action dated Jan. 14, 2022 for Chinese Patent Application No. 202010015642.4.

* cited by examiner

FIG. 8

| Sample | 1 | 2 | 3 | 4 | 5 | 6 |
|---|---|---|---|---|---|---|
| Base | SiN | SiO | SiN | SiO | SiN | SiO |
| F termination process (step A) | Not performed | | Performed (without pseudo catalyst) | | Performed (with pseudo catalyst) | |
| Thickness of SiN film (Å) | 71.2 | 65.0 | 56.6 | 36.0 | 42.4 | 5.3 |

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION(S)

This application is based upon and claims the benefit of priority from Japanese Patent Application No. 2019-053281, filed on Mar. 20, 2019, the entire contents of which are incorporated herein by reference.

TECHNICAL FIELD

The present disclosure relates to a method of manufacturing a semiconductor device, a substrate processing apparatus, and a recording medium.

BACKGROUND

As an example of a process of manufacturing a semiconductor device, a process of forming a film by selectively growing it on a surface of a specific base among a plurality of kinds of bases exposed at a surface of a substrate (hereinafter, this process will be referred to as selective growth) is often carried out.

SUMMARY

The present disclosure provides some embodiments of a technique capable of simplifying a process of manufacturing a semiconductor device.

According to one or more embodiments of the present disclosure, there is provided a technique that includes: (a) modifying a surface of one base among a first base and a second base to be F-terminated by supplying a fluorine-containing radical generated from a fluorine-containing gas to a substrate where the first base and the second base are exposed at a surface of the substrate; and (b) forming a film on a surface of the other base, which is different from the one base, among the first base and the second base by supplying a film-forming gas to the substrate after modifying the surface of the one base.

BRIEF DESCRIPTION OF DRAWINGS

The accompanying drawings, which are incorporated in and constitute a part of the specification, illustrate embodiments of the present disclosure.

FIG. 8 is a diagram illustrating each of measurement results of thickness of a silicon nitride film formed on the wafer.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

One or More Embodiments of the Present Disclosure

Embodiments of the present disclosure will now be described mainly with reference to FIGS. 1 to 4.

(1) Configuration of the Substrate Processing Apparatus

Figure 1:
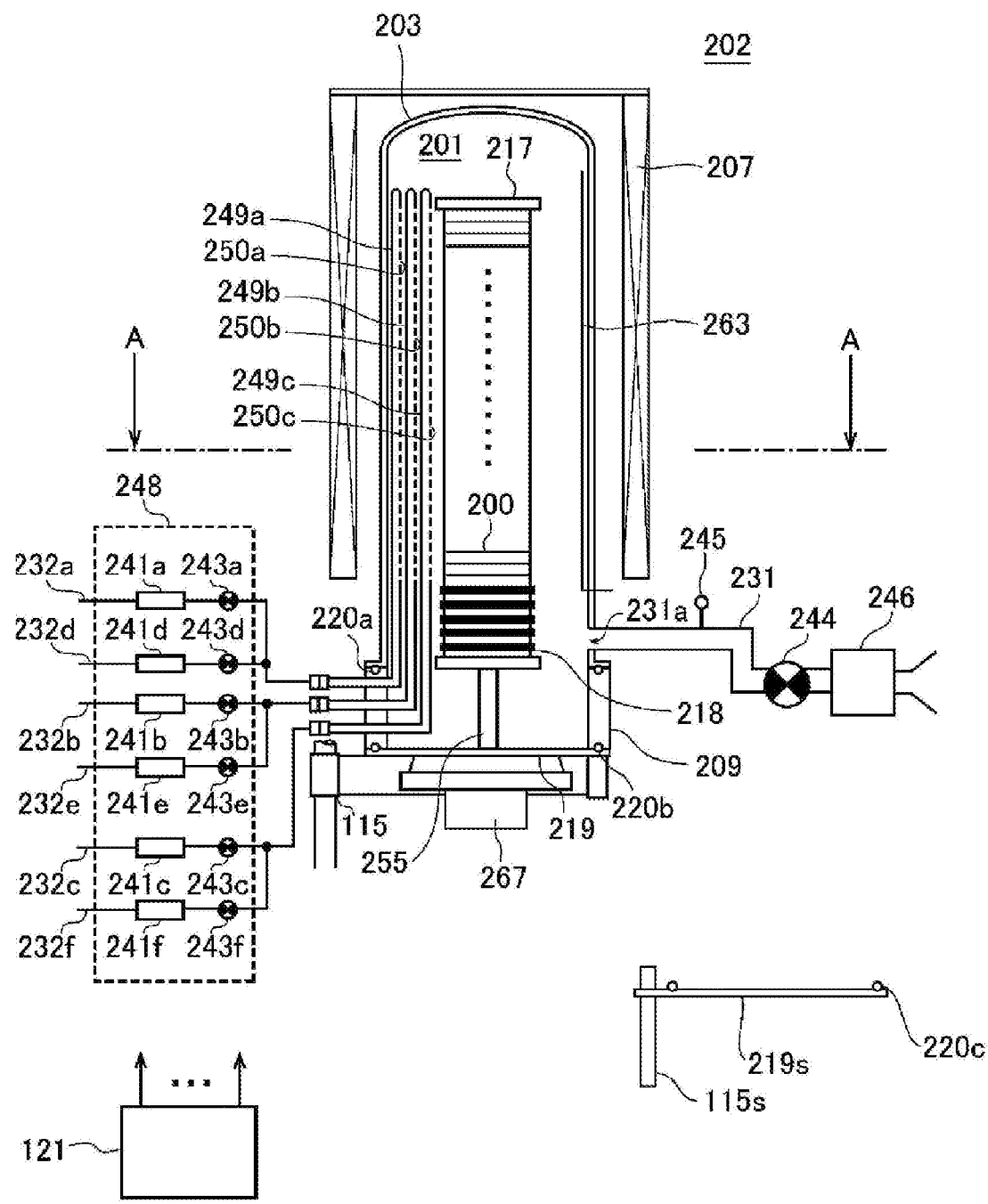
FIG. 1 is a schematic configuration diagram of a vertical type process furnace of a substrate processing apparatus suitably used in embodiments of the present disclosure, in which a portion of the process furnace 202 is shown in a vertical cross sectional view.

As illustrated in FIG. 1, a process furnace 202 includes a heater 207 as a heating mechanism (temperature adjustment part). The heater 207 has a cylindrical shape and is supported by a holding plate so as to be vertically installed. The heater 207 functions as an activation mechanism (an excitation part) configured to thermally activate (excite) a gas.

A reaction tube 203 is disposed inside the heater 207 to be concentric with the heater 207. The reaction tube 203 is made of a heat resistant material, e.g., quartz ($SiO_2$), silicon carbide (SiC), or the like, and has a cylindrical shape with its upper end closed and its lower end opened. A manifold 209 is disposed below the reaction tube 203 in a concentric relationship with the reaction tube 203. The manifold 209 is made of a metal material such as, e.g., stainless steel (SUS), and has a cylindrical shape with its upper and lower ends opened. The upper end of the manifold 209 engages with the lower end of the reaction tube 203. The manifold 209 is configured to support the reaction tube 203. An O-ring 220a as a seal member is installed between the manifold 209 and the reaction tube 203. Similar to the heater 207, the reaction tube 203 is vertically installed. A processing vessel (reaction vessel) mainly includes the reaction tube 203 and the manifold 209. A process chamber 201 is formed at a hollow cylindrical portion of the processing vessel. The process chamber 201 is configured to accommodate wafers 200 as substrates. The processing to the wafers 200 is performed in the process chamber 201.

Nozzles 249a to 249c as first to third supply parts are each installed in the process chamber 201 so as to penetrate a sidewall of the manifold 209. The nozzles 249a to 249c will also be referred to as first to third nozzles, respectively. The nozzles 249a to 249c are made of a heat resistant material such as quartz, SiC, or the like. Gas supply pipes 232a to 232c are connected to the nozzles 249a to 249c, respectively. The nozzles 249a to 249c are different nozzles, in which each of the nozzles 249a and 249c is installed adjacent to the nozzle 249b.

Mass flow controllers (MFCs) 241a to 241c, which are flow rate controllers (flow rate control parts), and valves 243a to 243c, which are opening/closing valves, are installed at the gas supply pipes 232a to 232c sequentially from the corresponding upstream sides of gas flow, respectively. Gas supply pipes 232d to 232f are connected to the gas supply pipes 232a to 232c at the downstream side of the valves 243a to 243c, respectively. MFCs 241d to 241f and valves 243d to 243f are installed at the gas supply pipes 232d to 232f sequentially from the corresponding upstream sides of gas flow, respectively. The gas supply pipes 232a to 232f are made of a metal material such as, e.g., stainless steel (SUS) or the like.

Figure 2:
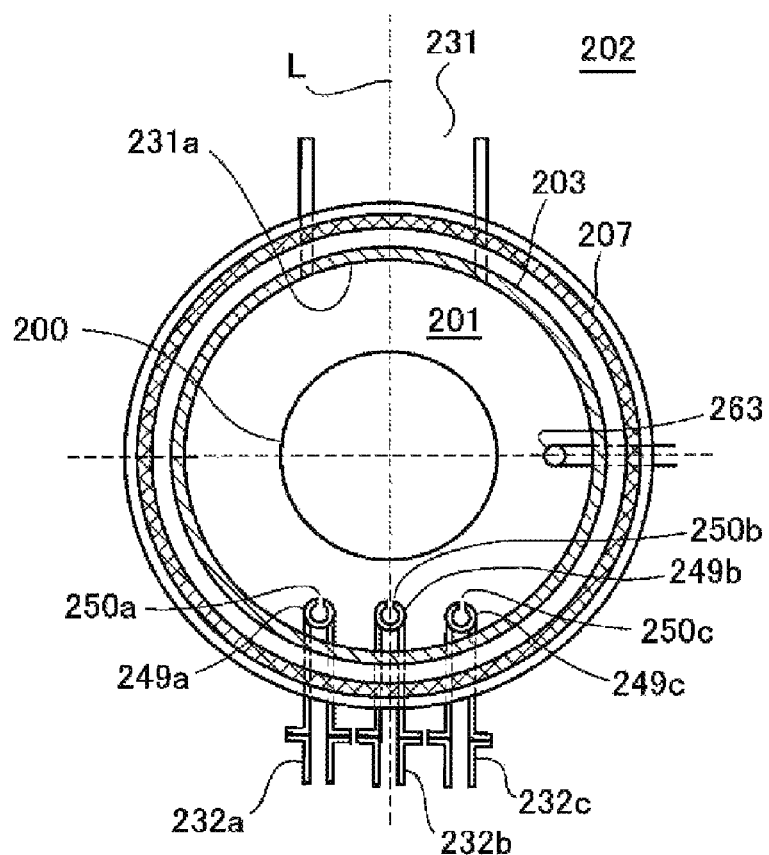
FIG. 2 is a schematic configuration diagram of a vertical type process furnace of the substrate processing apparatus suitably used in embodiments of the present disclosure, in which a portion of the process furnace 202 is shown in a cross sectional view taken along line A-A in FIG. 1.

As illustrated in FIG. 2, the nozzles 249a to 249c are installed at a space, which has an annular shape in a plan view, between an inner wall of the reaction tube 203 and the wafers 200 so as to extend upward along an arrangement direction of the wafers 200 from a lower portion of the inner wall of the reaction tube 203 to an upper portion of the inner wall of the reaction tube 203. Specifically, the nozzles 249a to 249c are installed at a lateral side of a wafer arrangement region at which the wafers 200 are arranged, namely at a region which horizontally surrounds the wafer arrangement region, so as to extend along the wafer arrangement region. The nozzle 249b is disposed to face an exhaust port 231a as described hereinbelow on a straight line in the plan view with the centers of the wafers 200 carried into the process chamber 201 interposed therebetween. The nozzles 249a and 249c are disposed so as to interpose a straight line L passing through the nozzle 249b and the center of the exhaust port 231a between both sides along the inner wall of the reaction tube 203 (the outer peripheral portion of the wafer 200). The straight line L is also a straight line passing through the nozzle 249b and the center of the wafer 200. That is, it may be also said that the nozzle 249c is installed at the opposite side of the nozzle 249a with the straight line L interposed therebetween. The nozzles 249a and 249c are disposed in line symmetry with the straight line L as a symmetry axis. Gas supply holes 250a to 250c for supplying a gas are formed at the side surfaces of the nozzles 249a to 249c, respectively. The gas supply holes 250a to 250c are opened to face the exhaust port 231a in the plan view so as to allow a gas to be supplied toward the wafers 200. The gas supply holes 250a to 250c may be formed in a plural number between the lower portion and the upper portion of the reaction tube 203.

A gas, which contains silicon (Si) as a main element constituting a film to be formed on the wafer 200 and a halogen element, i.e., a halosilane-based gas, is supplied from the gas supply pipe 232a into the process chamber 201 via the MFC 241a, the valve 243a, and the nozzle 249a. The halosilane-based gas acts as a film-forming gas, i.e., a Si source (precursor gas). The halogen element includes chlorine (Cl), fluorine (F), bromine (Br), iodine (I), and the like. As the halosilane-based gas, it is possible to use, for example, a chlorosilane-based gas containing Si and Cl, for example, a silicon tetrachloride ($SiCl_4$) gas.

A fluorine (F)-containing gas is supplied from the gas supply pipe 232b into the process chamber 201 via the MFC 241b, the valve 243b, and the nozzle 249b. As the F-containing gas, it is possible to use, for example, a chlorine trifluoride ($ClF_3$) gas.

A hydrogen nitride-based gas, which is a nitrogen (N)-containing gas, is supplied from the gas supply pipe 232c into the process chamber 201 via the MFC 241c, the valve 243c, and the nozzle 249c. The hydrogen nitride-based gas acts as the film-forming gas, i.e., an N source (a nitriding gas or a nitriding agent). As the hydrogen nitride-based gas, it is possible to use, for example, an ammonia ($NH_3$) gas.

An inert gas, for example, a nitrogen ($N_2$) gas, is supplied from the gas supply pipes 232d to 232f into the process chamber 201 via the MFCs 241d to 241f, the valves 243d to 243f, the gas supply pipes 232a to 232c, and the nozzles 249a to 249c. The $N_2$ gas acts as a purge gas, a carrier gas, a dilution gas, or the like.

A film-forming gas supply system (a precursor gas supply system or a reaction gas supply system) mainly includes the gas supply pipes 232a and 232c, the MFCs 241a and 241c, and the valves 243a and 243c. A fluorine-containing gas supply system mainly includes the gas supply pipe 232b, the MFC 241b, and the valve 243b. An inert gas supply system mainly includes the gas supply pipes 232d to 232f, the MFCs 241d to 241f, and the valves 243d to 243f.

One or all of various supply systems described above may be configured as an integrated supply system 248 in which the valves 243a to 243f, the MFCs 241a to 241f, and the like are integrated. The integrated supply system 248 is connected to each of the gas supply pipes 232a to 232f so that a supply operation of various kinds of gases into the gas supply pipes 232a to 232f, i.e., an opening/closing operation of the valves 243a to 243f, a flow-rate-adjusting operation by the MFCs 241a to 241f, or the like, is controlled by a controller 121 which will be described below. The integrated supply system 248 is configured as an integral type or division type integrated unit, and is also configured so that it is detachable from the gas supply pipes 232a to 232f or the like, so as to perform maintenance, replacement, expansion, or the like of the integrated supply system 248, on an integrated unit basis.

The exhaust port 231a configured to exhaust an internal atmosphere of the process chamber 201 is installed at a lower side of the sidewall of the reaction tube 203. As illustrated in FIG. 2, the exhaust port 231a is installed at a position facing the nozzles 249a to 249c (the gas supply holes 250a to 250c) with the wafers 200 interposed therebetween in the plan view. The exhaust port 231a may be installed between the lower portion and the upper portion of the sidewall of the reaction tube 203, i.e., along the wafer arrangement region. An exhaust pipe 231 is connected to the exhaust port 231a. A vacuum pump 246 as a vacuum exhaust device is connected to the exhaust pipe 231 via a pressure sensor 245 as a pressure detector (pressure detection part) which detects the internal pressure of the process chamber 201 and an APC (auto pressure controller) valve 244 as a pressure regulator (pressure regulation part). The APC valve 244 is configured so that a vacuum exhaust and a vacuum exhaust stop of the interior of the process chamber 201 can be performed by opening and closing the APC valve 244 while operating the vacuum pump 246 and so that the internal pressure of the process chamber 201 can be adjusted by adjusting an opening degree of the APC valve 244 based on pressure information detected by the pressure sensor 245 while operating the vacuum pump 246. An exhaust system mainly includes the exhaust pipe 231, the APC valve 244, and the pressure sensor 245. The vacuum pump 246 may be regarded as being included in the exhaust system.

A seal cap 219, which serves as a furnace opening cover configured to hermetically seal a lower end opening of the manifold 209, is installed under the manifold 209. The seal cap 219 is made of a metal material such as, e.g., stainless steel (SUS) or the like, and is formed in a disc shape. An O-ring 220b, which is a seal member making contact with the lower end portion of the manifold 209, is installed at an upper surface of the seal cap 219. A rotation mechanism 267 configured to rotate a boat 217, which will be described below, is installed under the seal cap 219. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism installed outside the reaction tube 203. The boat elevator 115 is configured as a transfer device (transfer mechanism) which loads and unloads (transfers) the wafers 210 into and from (out of) the process chamber 201 by moving the seal cap 219 up and down. A shutter 219s as a furnace opening cover capable of hermetically seal the lower end opening of the manifold 209, with the boat 217 unloaded from the interior of the process chamber 201 by moving the seal cap 219 down, is installed under the manifold 209. The shutter 219s is made of a metal material such as, e.g., stainless steel or the like, and is formed in a disc shape. An O-ring 220c as a seal member making contact with the lower end portion of the manifold 209 is installed at an upper surface of the shutter 219s. An opening/closing operation (an up-down movement operation or a rotational movement operation) of the shutter 219s is controlled by a shutter-opening/closing mechanism 115s.

The boat 217 serving as a substrate support is configured to support a plurality of wafers 200, e.g., 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of a heat resistant material such as quartz, SiC, or the like. Heat-insulating plates 218 made of a heat resistant material such as quartz, SiC, or the like are installed below the boat 217 in multiple stages.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. The temperature sensor 263 is installed along the inner wall of the reaction tube 203.

Figure 3:
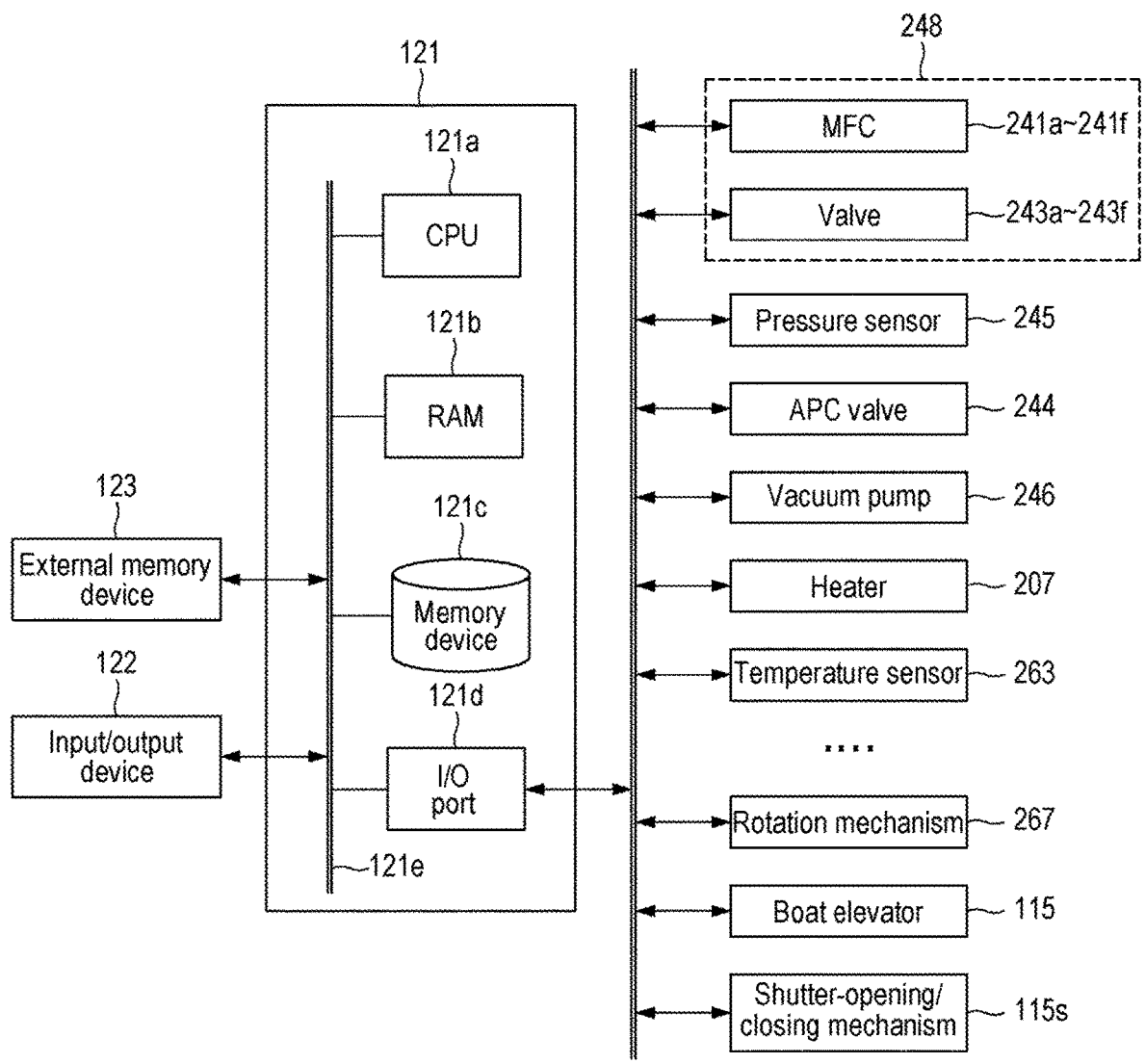
FIG. 3 is a schematic configuration diagram of a controller 121 of the substrate processing apparatus suitably used in embodiments of the present disclosure, in which a control system of the controller 121 is shown in a block diagram.

As illustrated in FIG. 3, the controller 121, which is a control part (control means), may be configured as a computer including a CPU (central processing unit) 121a, a RAM (random access memory) 121b, a memory device 121c, and an I/O port 121d. The RAM 121b, the memory device 121c, and the I/O port 121d are configured to exchange data with the CPU 121a via an internal bus 121e. An input/output device 122 formed of, e.g., a touch panel or the like, is connected to the controller 121.

The memory device 121c is configured by, for example, a flash memory, a HDD (hard disk drive), or the like. A control program for controlling operations of a substrate processing apparatus, a process recipe for specifying sequences and conditions of substrate processing as described hereinbelow, or the like is readably stored in the memory device 121c. The process recipe functions as a program for causing the controller 121 to execute each sequence in the substrate processing, as described hereinbelow, to obtain a predetermined result. Hereinafter, the process recipe and the control program will be generally and simply referred to as a "program." Furthermore, the process recipe will be simply referred to as a "recipe." When the term "program" is used herein, it may indicate a case of including only the recipe, a case of including only the control program, or a case of including both the recipe and the control program. The RAM 121b is configured as a memory area (work area) in which a program, data, or the like read by the CPU 121a is temporarily stored.

The I/O port 121d is connected to the MFCs 241a to 241f, the valves 243a to 243f, the pressure sensor 245, the APC valve 244, the vacuum pump 246, the temperature sensor 263, the heater 207, the rotation mechanism 267, the boat elevator 115, the shutter-opening/closing mechanism 115s, and the like, as described above.

The CPU 121a is configured to read the control program from the memory device 121c and execute the same. The CPU 121a is also configured to read the recipe from the memory device 121c according to an input of an operation command from the input/output device 122. In addition, the CPU 121a is configured to control, according to the contents of the recipe thus read, the flow-rate-adjusting operation of various kinds of gases by the MFCs 241a to 241f, the opening/closing operation of the valves 243a to 243f, the opening/closing operation of the APC valve 244, the pressure-regulating operation performed by the APC valve 244 based on the pressure sensor 245, the driving and stopping of the vacuum pump 246, the temperature-adjusting operation performed by the heater 207 based on the temperature sensor 263, the operations of rotating the boat 217 and adjusting the rotation speed of the boat 217 with the rotation mechanism 267, the operation of moving the boat 217 up and down with the boat elevator 115, the operations of opening and closing the shutter 219s with the shutter-opening/closing mechanism 115s, and the like.

The controller 121 may be configured by installing, on the computer, the aforementioned program stored in an external memory device 123. The external memory device 123 may include, for example, a magnetic disc such as an HDD, an optical disc such as a CD, a magneto-optical disc such as an MO, a semiconductor memory such as a USB memory, and the like. The memory device 121c or the external memory device 123 is configured as a computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer using a communication means such as the Internet or a dedicated line, instead of using the external memory device 123.

(2) Substrate-Processing Process

A process sequence example of selective growth in which a film is formed by selectively growing it on a surface of a specific base among a plurality of kinds of bases exposed at a surface of a wafer 200 as a substrate using the aforementioned substrate processing apparatus, which is one of the processes for manufacturing a semiconductor device, will be described mainly with reference to FIGS. 4 and 5A to 5D. In the following descriptions, the operations of the respective parts constituting the substrate processing apparatus are controlled by the controller 121.

Figure 4:
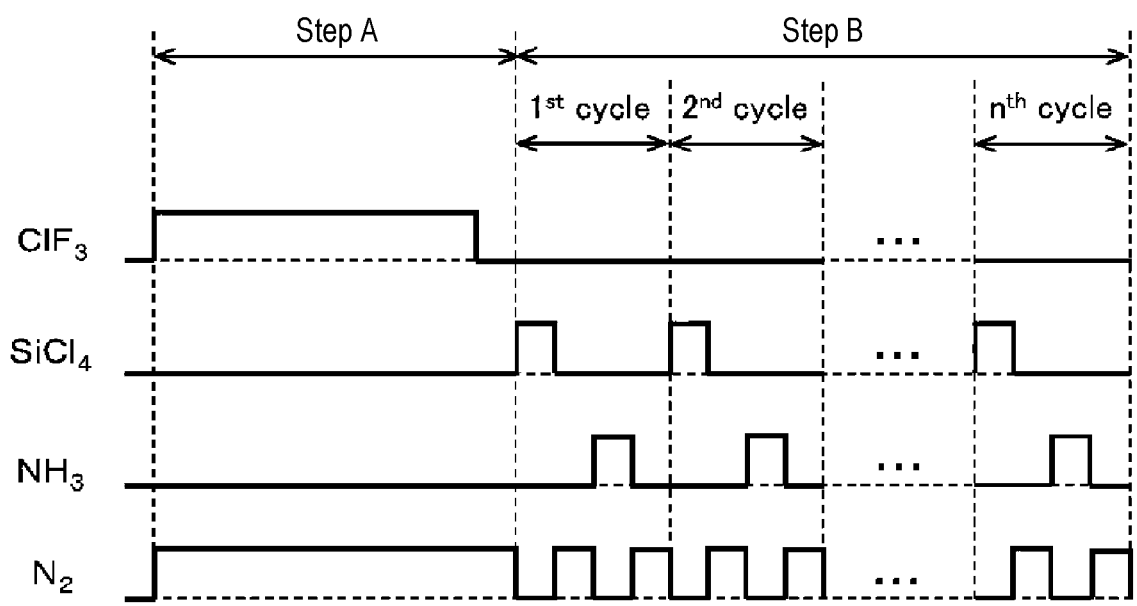
FIG. 4 is a diagram illustrating a process sequence of selective growth according to embodiments of the present disclosure.

In the film-forming sequence illustrated in FIG. 4, there are performed: step A of modifying a surface of one base (here, a base 200a) of bases 200a and 200b to be F-terminated by supplying a F-containing radical generated from a ClF$_3$ gas as a fluorine-containing gas to a wafer 200 on which a first base (base 200a) including a silicon oxide film (SiO film) and a second base (base 200b) including a silicon nitride film (SiN film) are exposed at its surface; and step B of forming a SiN film which is a film containing Si and N as a film on a surface of the other base (here, the base 200b) different from the one base of the base 200a and the base 200b by supplying a SiCl$_4$ gas and an NH$_3$ gas as film-forming gases to the wafer 200 after the surface of the base 200a is modified.

Furthermore, in FIG. 4, a case where at step B, a cycle which non-simultaneously performs step B1 of supplying a SiCl$_4$ gas to the wafer 200 and step B2 of supplying an NH$_3$ gas to the wafer 200 is performed a predetermined number of times (n times, where n is an integer of 1 or more) is illustrated.

In the present disclosure, for the sake of convenience, the film-forming sequence illustrated in FIG. 4 may sometimes be denoted as follows. The same denotation will be used in the modifications and the like as described hereinbelow.

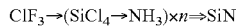

ClF$_3$→(SiCl$_4$→NH$_3$)×n⇒SiN

When the term "wafer" is used herein, it may refer to a wafer itself or a laminated body of a wafer and a predetermined layer or film formed on the surface of the wafer. In addition, when the phrase "a surface of a wafer" is used herein, it may refer to a surface of a wafer itself or a surface of a predetermined layer or the like formed on the wafer. Furthermore, in the present disclosure, the expression "a predetermined layer is formed on a wafer" may mean that a predetermined layer is directly formed on a surface of the wafer itself or that a predetermined layer is formed on a layer or the like formed on the wafer. In addition, when the term "substrate" is used herein, it may be synonymous with the term "wafer."

(Wafer Charging and Boat Loading)

If a plurality of wafers 200 is charged on the boat 217 (wafer charging), the shutter 219s may be moved by the shutter-opening/closing mechanism 115s to open the lower end opening of the manifold 209 (shutter opening). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the manifold 209 via the O-ring 220b.

Figure 5A:
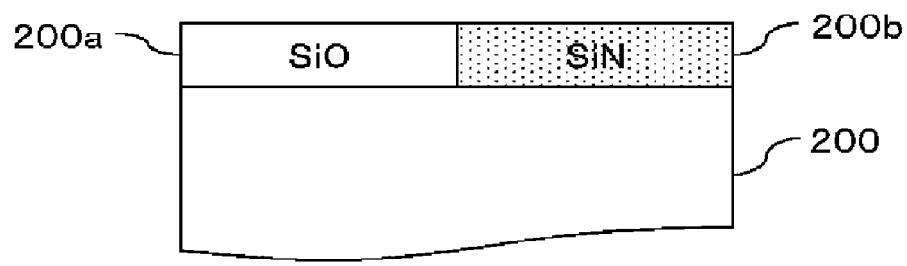
FIG. 5A is an enlarged partial cross sectional view of a surface of a wafer 200 on which a base 200a including a silicon oxide film and a base 200b including a silicon nitride film are each exposed.
Figure 6:
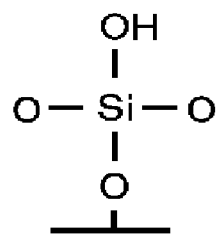
FIG. 6 is an enlarged partial cross sectional view of the surface of the base 200a in the wafer 200 before a modification process.

As illustrated in FIG. 5A, a plurality of kinds of bases, for example, a base 200a including an oxygen (O)-containing film, i.e., a SiO film as an oxide film, and an O-free film, i.e., a base 200b including a SiN film as a nitride film which is a non-oxide film, are exposed in advance on the surface of the wafer 200. The base 200a includes a surface terminated with a hydroxyl group (OH) as illustrated in FIG. 6 over the entire region (entire surface). The base 200b has a surface in which many regions are not OH-terminated, i.e., a surface in which some regions are OH-terminated.

(Pressure Regulation and Temperature Adjustment)

The interior of the process chamber 201, namely the space in which the wafers 200 are located, is vacuum-exhausted (depressurization-exhausted) by the vacuum pump 246 so as to reach a desired pressure (degree of vacuum). In this operation, the internal pressure of the process chamber 201 is measured by the pressure sensor 245. The APC valve 244 is feedback-controlled based on the measured pressure information. Furthermore, the wafer 200 in the process chamber 201 is heated by the heater 207 to a desired processing temperature. In this operation, the state of supplying electric power to the heater 207 is feedback-controlled based on the temperature information detected by the temperature sensor 263 such that the interior of the process chamber 201 has a desired temperature distribution. In addition, the rotation of the wafer 200 by the rotation mechanism 267 begins. The exhaust of the interior of the process chamber 201 and the heating and rotation of the wafer 200 may be all continuously performed at least until the processing to the wafer 200 is completed.

(Selective Growth)

Next, the following steps A and B are sequentially performed.

[Step A]

At this step, a ClF$_3$ gas is supplied to the wafer 200 accommodated within the process chamber 201, i.e., the wafer 200 in which the base 200a and the base 200b are exposed at its surface.

Specifically, the valve 243b is opened to allow a ClF$_3$ gas to flow into the gas supply pipe 232b. The flow rate of the ClF$_3$ gas is adjusted by the MFC 241b. The ClF$_3$ gas is supplied into the process chamber 201 via the nozzle 249b and is exhausted from the exhaust port 231a. At this time, the ClF$_3$ gas is supplied to the wafer 200 (ClF$_3$ gas supply). Simultaneously, the valves 243d and 243f are opened to supply an N$_2$ gas into the process chamber 201 via the nozzles 249a and 249c, respectively. The supply of the N$_2$ gas may not be performed.

Examples of the processing conditions at this step may be described as follows:

Supply flow rate of ClF$_3$ gas: 1 to 2,000 sccm, or 1 to 500 sccm in some embodiments Supply time of ClF$_3$ gas: 1 second to 60 minutes Supply flow rate of N$_2$ gas (per gas supply pipe): 0 to 10,000 sccm Processing temperature: room temperature (25 degrees C.) to 300 degrees C., or room temperature to 200 degrees C. in some embodiments Processing pressure: 1 to 2,000 Pa, or 1 to 1,000 Pa in some embodiments.

The conditions described herein are conditions for not etching the surface of the base 200a, and are also conditions for modifying the surface of the base 200a to be F-terminated, as will be described below.

Furthermore, in the present disclosure, the expression of the numerical range such as "1 to 2,000 Pa" may mean that a lower limit value and an upper limit value are included in that range. Therefore, for example, "1 to 2,000 Pa" may mean "1 Pa or higher and 2,000 Pa or lower". The same applies to other numerical ranges.

If the processing temperature at this step is lower than a room temperature (25 degrees C.), the surface of the base 200a may not be sufficiently modified. By setting the processing temperature to become the room temperature or higher, the surface of the base 200a can be sufficiently modified. If the processing temperature exceeds 300 degrees C., at least one selected from the group of the bases (base films) 200a and 200b, particularly the surface of the base 200b, may be etched to cause etching damage. By setting the processing temperature at 300 degrees C. or lower, it is possible to suppress the etching of the surface of at least one selected from the group of the bases (base films) 200a and 200b, particularly the base 200b, and to suppress the etching damage to the surface of the base 200b. By setting the processing temperature at 200 degrees C. or lower, it is possible to reliably achieve the aforementioned effects.

Figure 7A:
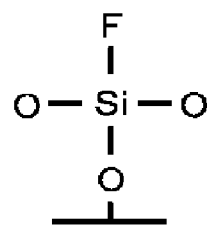
FIGS. 7A to 7D are enlarged partial cross sectional views of the surface of the base 200a in the wafer 200 after the modification process.
Figure 7B:
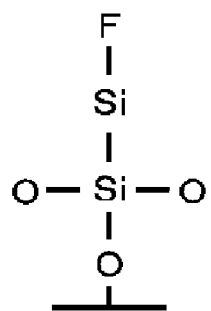
Figure 7C:
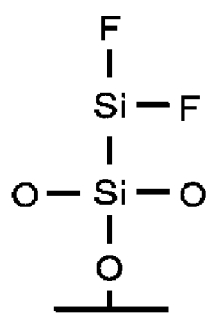
Figure 7D:
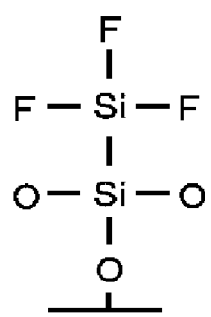

By supplying the $ClF_3$ gas to the wafer 200 under the aforementioned conditions, it is possible to generate a F-containing radical from the $ClF_3$ gas and react the surface of the base 200a with the F-containing radical. The F-containing radical may include F, $ClF_2$, ClF, and the like. At this step, the surface of the base 200a can be modified to be F-terminated without being etched by the action of the F-containing radical generated from the $ClF_3$ gas. The modified base 200a includes a F-terminated surface. Specifically, the OH group on the surface of the base 200a is substituted by a F-containing material such as F as illustrated in FIG. 7A to allow the surface of the base 200a to be F-terminated. As the surface of the base 200a is F-terminated, the film-forming reaction becomes difficult to go ahead on the surface of the base 200a at step B which will be described below. Precisely, the time until the film-forming reaction occurs, i.e., the incubation time, can be prolonged. Furthermore, the surface of the base 200a F-terminated becomes a surface which does not substantially contain an organic component.

Figure 5B:
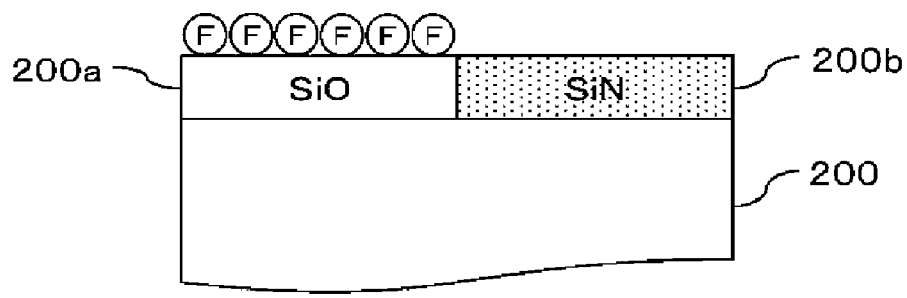
FIG. 5B is an enlarged partial cross sectional view of the surface of the wafer 200 after the surface of the base 200a is selectively modified using a fluorine-containing radical generated from a fluorine-containing gas.

As illustrated in FIG. 5B, at this step, the surface of the base 200a can be selectively (preferentially) modified while suppressing the modification of the surface of the base 200b. At this time, a portion of the surface of the base 200b may be modified, but the amount of the modification is smaller than the amount of the modification of the surface of the base 200a. Such selective (preferential) modification is possible because many regions of the surface of the base 200b before the start of step A are not OH-terminated, whereas the entire region of the surface of the base 200a is OH-terminated. Since the OH termination is not formed at many regions of the surface of the base 200b, the F termination is not formed at such many regions. However, as described above, the OH termination may be formed at the partial region of the surface of the base 200b, and in this case, the F termination may be formed at the partial region by the action of the F-containing radical. On the other hand, since the OH termination is formed at the entire region of the surface of the base 200a, a very stable F termination is formed at the entire region of the surface by the action of the F-containing radical.

Furthermore, a portion of the surface of the base 200b may be etched by the F-containing radical. However, even when a portion of the surface of the base 200b is etched, the etching amount is small, and the surface of the base 200b may receive almost no etching damage by adjusting the processing conditions. Even when a portion of the surface of the base 200b is modified or a portion of the surface of the base 200b is etched, adsorption sites are kept at many regions of the surface of the base 200b.

After the surface of the base 200a among the bases 200a and 200b is selectively modified, the valve 243b is closed to stop the supply of the $ClF_3$ gas into the process chamber 201. Then, the gas or the like remaining within the process chamber 201 is removed from the interior of the process chamber 201 according to the same processing procedures as those of purge at step A.

As the F-containing gas, it may be possible to use, in addition to the $ClF_3$ gas, a fluorine ($F_2$) gas, a chlorine fluoride gas (ClF) gas, a $F_2$+nitrogen monoxide (NO) gas, a $ClF_3$+NO gas, a ClF+NO gas, a nitrogen trifluoride ($NF_3$) gas, a nitrosyl fluoride (FNO) gas, a tungsten hexafluoride ($WF_6$) gas, or a mixed gas thereof.

[Step B]

At this step, steps B1 and B2 are sequentially performed.

[Step B1]

At this step, a $SiCl_4$ gas is supplied to the wafer 200 in the process chamber 201, i.e., the wafer 200 after the surface of the base 200a among the bases 200a and 200b is selectively modified.

Specifically, the valve 243a is opened to allow a $SiCl_4$ gas to flow into the gas supply pipe 232a. The flow rate of the $SiCl_4$ gas is adjusted by the MFC 241a. The $SiCl_4$ gas is supplied into the process chamber 201 via the nozzle 249a and is exhausted from the exhaust port 231a. At this time, the $SiCl_4$ gas is supplied to the wafer 200 ($SiCl_4$ gas supply). Simultaneously, the valves 243e and 243f may be opened to supply an $N_2$ gas into the process chamber 201 via the nozzles 249b and 249c, respectively.

Examples of the processing conditions at this step may be described as follows:

Supply flow rate of $SiCl_4$ gas: 1 to 2,000 sccm, or 10 to 1,000 sccm in some embodiments Supply time of $SiCl_4$ gas: 1 to 180 seconds, or 1 to 120 seconds in some embodiments Processing temperature: 350 to 600 degrees C., or 400 to 550 degrees C. in some embodiments Processing pressure: 1 to 2,000 Pa, or 10 to 1,333 Pa in some embodiments.

Other processing conditions may be similar to the processing conditions of step A.

By supplying the $SiCl_4$ gas to the wafer 200 under the aforementioned conditions, a Si-containing layer containing Cl is formed on the surface of the base 200b including an unmodified region among the bases 200a and 200b. That is, the Si-containing layer containing Cl is formed, starting from the unmodified region of the base 200b, i.e., a region at which an adsorption site is kept. The Si-containing layer containing Cl is formed by chemical adsorption or physical adsorption of $SiCl_4$ to the surface of the base 200b, chemical adsorption of a substance ($SiCl_x$) from which a portion of $SiCl_4$ is decomposed, deposition of Si by thermal decomposition of $SiCl_4$, or the like. The Si-containing layer containing Cl may be an adsorption layer (a physical adsorption layer or a chemical adsorption layer) of $SiCl_4$ or $SiCl_x$, or may be a deposit layer of Si containing Cl. In the present disclosure, the Si-containing layer containing Cl will be simply referred to as a Si-containing layer.

At this step, it is possible to selectively form the Si-containing layer on the surface of the base 200b while suppressing the formation of the Si-containing layer on the surface of the base 200a. Furthermore, when the surface of the base 200a is insufficiently modified due to certain factors, the Si-containing layer may be very slightly formed on the surface of the base 200a, but also in this case, the thickness of the Si-containing layer formed on the surface of the base 200a becomes much smaller than the thickness of the Si-containing layer formed on the surface of the base 200b. Such selective formation of the Si-containing layer is possible because the F termination existing on the surface of the base 200a acts as a factor that inhibits the formation of the Si-containing layer (adsorption of Si) on the surface of the base 200a, i.e., as an inhibitor. In addition, the F termination existing on the surface of the base 200a is stably kept without being eliminated even when this step is performed.

After the Si-containing layer is formed on the surface of the base 200b, the valve 243a is closed to stop the supply of the SiCl₄ gas into the process chamber 201. Then, the gas or the like remaining within the process chamber 201 is removed from the interior of the process chamber 201 according to the same processing procedures as those of the purge at step A (purge).

As the precursor gas (film-forming gas), it may be possible to use, in addition to the SiCl₄ gas, a chlorosilane-based gas such as a monochlorosilane (SiH₃Cl, abbreviation: MCS) gas, a dichlorosilane (SiH₂Cl₂, abbreviation: DCS) gas, a trichlorosilane (SiHCl₃, abbreviation: TCS) gas, a hexachlorodisilane (Si₂Cl₆, abbreviation: HCDS) gas, an octachlorotrisilane (Si₃Cl₈, abbreviation: OCTS) gas or the like, a bromosilane-based gas such as a tetrabromosilane (SiBr₄) gas or the like, or an iodosilane-based gas such as a tetraiodosilane (SiI₄) gas or the like.

[Step B2]

At this step, an NH₃ gas is supplied to the wafer 200 in the process chamber 201, i.e., the Si-containing layer formed on the base 200b.

Specifically, the valve 243c is opened to allow an NH₃ gas to flow into the gas supply pipe 232c. The flow rate of the NH₃ gas is adjusted by the MFC 241c. The NH₃ gas is supplied into the process chamber 201 via the nozzle 249c and is exhausted from the exhaust port 231a. At this time, the NH₃ gas is supplied to the wafer 200 (NH₃ gas supply). Simultaneously, the valves 243d and 243e may be opened to supply an N₂ gas into the process chamber 201 via the nozzles 249a and 249b, respectively.

Examples of the processing conditions at this step may be described as follows:

Supply flow rate of NH₃ gas: 10 to 10,000 sccm
Supply time of NH₃ gas: 1 to 60 seconds, or 5 to 50 seconds in some embodiments Processing pressure: 1 to 4,000 Pa, or 1 to 1,333 Pa in some embodiments.

Other processing conditions may be similar to the processing conditions of step A.

By supplying the NH₃ gas to the wafer 200 under the aforementioned conditions, at least a portion of the Si-containing layer formed on the surface of the base 200b is nitrided (modified). As the Si-containing layer is modified, a layer containing Si and N, i.e., a silicon nitride layer (SiN layer), is formed on the surface of the base 200b. When forming the SiN layer, an impurity such as Cl contained in the Si-containing layer constitutes a gaseous substance containing at least Cl in the process of the modification reaction of the Si-containing layer with the NH₃ gas and is discharged from the interior of the process chamber 201. Thus, the SiN layer becomes a layer having a smaller amount of impurity such as Cl or the like than the Si-containing layer formed at step B1. Furthermore, the surface of the base 200a is kept without being modified even when this step is performed. That is, the surface of the base 200a is stably kept while being F-terminated without being modified (NH-terminated).

After the SiN layer is formed on the surface of the base 200b, the valve 243c is closed to stop the supply of the NH₃ gas into the process chamber 201. Then, the gas or the like remaining within the process chamber 201 is removed from the interior of the process chamber 201 according to the same processing procedures as those of the purge at step A (purge).

As the reaction gas (film-forming gas), it may be possible to use, in addition to the NH₃ gas, for example, a hydrogen nitride-based gas such as a diazene (N₂H₂) gas, a hydrazine (N₂H₄) gas, a N₃H₈ gas, or the like.

[Performing a Predetermined Number of Times]

Figure 5C:
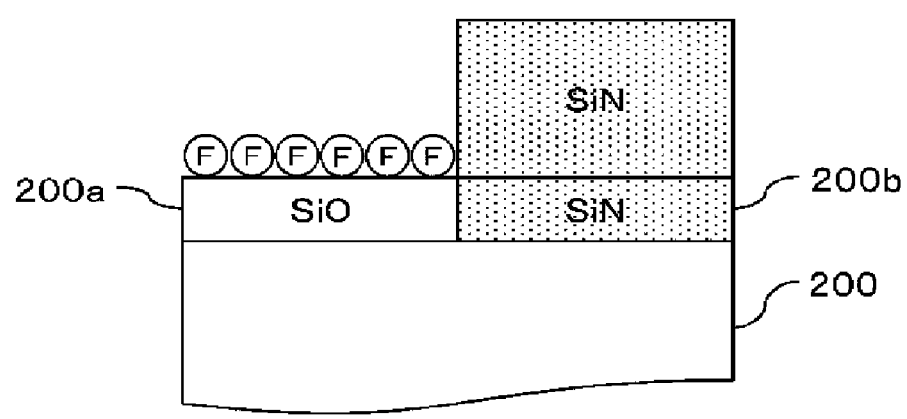
FIG. 5C is an enlarged partial cross sectional view of the surface of the wafer 200 after the silicon nitride film is selectively formed on the surface of the base 200b.

A cycle which non-simultaneously, i.e., non-synchronously, performs steps B1 and B2 described above is performed a predetermined number of times (n times, where n is an integer of 1 or more), whereby a SiN film can be formed on the surface of the base 200b among the bases 200a and 200b exposed at the surface of the wafer 200, as illustrated in FIG. 5C. The aforementioned cycle may be repeated multiple times. That is, the thickness of the SiN layer formed per one cycle may be set smaller than a desired film thickness, and the aforementioned cycle may be repeated multiple times until the film thickness of the SiN film formed by laminating the SiN layer becomes equal to the desired film thickness.

Furthermore, when performing steps B1 and B2, since the F termination existing on the surface of the base 200a is kept without being eliminated, no SiN film is formed on the surface of the base 200a. However, when the surface of the base 200a is not sufficiently modified due to certain factors, the SiN film may be very slightly formed on the surface of the base 200a, but also in this case, the thickness of the SiN film formed on the surface of the base 200a is much smaller than the thickness of the SiN film formed on the surface of the base 200b. In the present disclosure, the expression "selectively forming the SiN film on the surface of the base 200b" among the bases 200a and 200b may include not only a case where no SiN film is formed on the surface of the base 200a, but also a case where a very thin SiN film is formed on the surface of the base 200a, as described above.

(After-Purge and Atmospheric Pressure Return)

After the selective formation of the SiN film on the base 200b is completed, the N₂ gas as a purge gas is supplied from each of the nozzles 249a to 249c into the process chamber 201 and is exhausted from the exhaust port 231a. Thus, the interior of the process chamber 201 is purged and the gas or the reaction byproduct, which remains within the process chamber 201, is removed from the interior of the process chamber 201 (after-purge). Thereafter, the internal atmosphere of the process chamber 201 is substituted by an inert gas (inert gas substitution). The internal pressure of the process chamber 201 is returned to an atmospheric pressure (atmospheric pressure return).

(Boat Unloading and Wafer Discharging)

The seal cap 219 is moved down by the boat elevator 115 to open the lower end of the manifold 209. Then, the processed wafers 200 supported on the boat 217 are unloaded from the lower end of the manifold 209 to the outside of the reaction tube 203 (boat unloading). After the boat unloading, the shutter 219s is moved so that the lower end opening of the manifold 209 is sealed by the shutter 219s via the O-ring 220c (shutter closing). The processed wafers 200 are unloaded to the outside of the reaction tube 203 and are subsequently discharged from the boat 217 (wafer discharging).

Figure 5D:
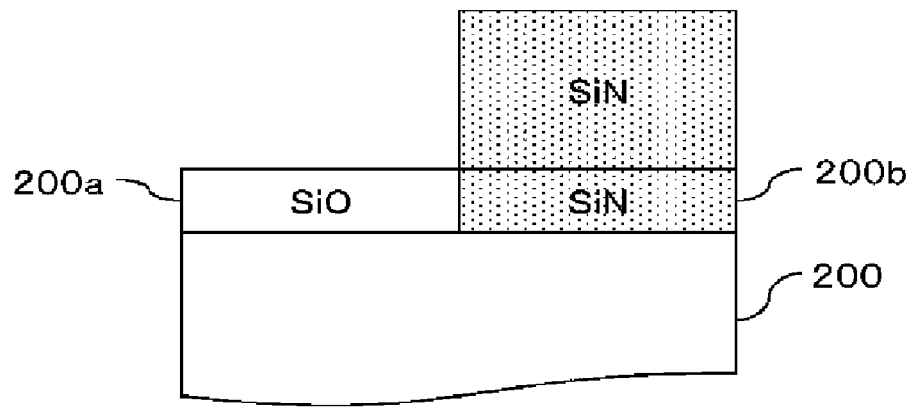
FIG. 5D is an enlarged partial cross sectional view of the surface of the wafer 200 after the wafer 200 illustrated in FIG. 5C is exposed to the air.

Furthermore, as illustrated in FIG. 5D, the F termination existing on the surface of the base 200a is eliminated by reacting with a predetermined reaction product, specifically, moisture (H₂O) in the atmosphere when the processed wafer 200 is exposed to the air. That is, the F termination existing on the surface of the base 200a can be removed by the atmospheric exposure of the processed wafer 200. By removing the F termination from the surface of the base 200a, the surface state of the base 200a is reset, and the film-forming process can go ahead on the surface of the base 200a at a subsequent step.

(3) Effects According to the Present Embodiments

According to the present embodiments, one or more effects as set forth below may be achieved.

(a) By performing steps A and B, it is possible to selectively form a SiN film on the surface of the base 200b among the bases 200a and 200b exposed at the surface of the wafer 200. This makes it possible to simplify their processes, such as omitting a patterning process including photolithography, for example, when manufacturing a semiconductor device. As a result, it is possible to improve the productivity of the semiconductor device and to reduce the manufacturing cost.

(b) By exposing the processed wafer 200 to the air after performing step B, it is possible to eliminate the F termination as an inhibitor existing on the surface of the base 200a. Since the F-termination can be easily removed in this way, there is no need to separately prepare a step of removing the inhibitor. Thus, it is possible to simplify the process of manufacturing the semiconductor device, to improve the productivity of the semiconductor device, and to reduce the manufacturing cost.

(c) Since at least one selected from the group of steps A and B, or each of steps A and B in some embodiments is performed in a non-plasma atmosphere, it is possible to avoid plasma damage to the wafer 200. Thus, this method can be applied to a process of worrying about plasma damage.

(d) For example, if a recess such as a groove or the like is formed on the surface of the wafer 200, a film similar to the film to be formed is formed on the bottom surface of the recess, and a film different from the film to be formed is formed on the side surface thereof, when the film is formed by a CVD method, an alternate supply method, or the like so as to embed the recess, a void or seam may be formed in the film formed depending on the shape of the recess. According to the method of the present embodiments, it is possible to perform bottom-up growth in which a film is grown upward from the bottom surface side of the recess, and to perform void-free and seamless embedding.

(e) Furthermore, for example, if the SiN film is used as a mask, when the SiN film is etched, the shape of the mask may be deformed. In this case, by using the method of the present embodiments, it is possible to repair the shape of the mask and to perform etching in an intended shape until a desired etching process is completed.

(f) Moreover, for example, if SADP (self-aligned double patterning) is performed, when exposure and etching are repeated, fine accuracy may be deteriorated. In this case, finally, it is possible to improve the patterning accuracy by adjusting the film thickness by the selective growth according to the method of the present embodiments.

(g) The effects mentioned above can be similarly achieved in the case where a F-containing gas other than the $ClF_3$ gas is used, in the case where a precursor gas other than the $SiCl_4$ gas is used, in the case where a reaction gas other than the $NH_3$ gas is used, or in the case where an inert gas other than the $N_2$ gas is used.

Other Embodiments of the Present Disclosure

While embodiments of the present disclosure have been specifically described above, the present disclosure is not limited to the aforementioned embodiments but may be variously modified without departing from the spirit of the present disclosure.

For example, at step A, the generation of a F-containing radical may be promoted by supplying a F-containing gas in an atmosphere in which a pseudo catalyst exists. That is, at step A, the generation of the F-containing radical is promoted by supplying the F-containing gas into the process chamber 201 accommodating the pseudo catalyst, and the surface of the base 200a among the bases 200a and 200b may be selectively (preferentially) modified by supplying the radical generated in this way to the surface of the wafer 200. The term "pseudo catalyst" herein refers to a substance of promoting the decomposition of the F-containing gas and urging the generation of the F-containing radical from the F-containing gas. The generation of the F-containing radical from the F-containing gas can be promoted by the pseudo catalytic action occurring by bringing the F-containing gas into contact with the pseudo catalyst, whereby the F-containing radical can be efficiently generated.

As the pseudo catalyst, it is possible to use, for example, Si of a solid whose outermost surface is not covered with a natural oxide film (SiO film), i.e., a Si member exhibited by exposing a Si material on the outermost surface. As such a member, for example, a wafer made of Si from which the natural oxide film formed on the outermost surface is removed by cleaning or the like using a hydrogen fluoride (HF) aqueous solution, for example, a bare Si wafer (hereinafter, referred to as a bare wafer), may be used. In addition, the natural oxide film is formed on the outermost surface of the bare wafer stored in the atmosphere and the Si material is not exposed at the outermost surface, and therefore, the bare wafer cannot be used as the pseudo catalyst as it is. In order for the bare wafer to act as the pseudo catalyst, it is necessary to remove the natural oxide film formed on the outermost surface of the bare wafer and to create a state in which the Si material is exposed at the outermost surface.

When the bare wafer from which the natural oxide film is removed is used as the pseudo catalyst, the bare wafer from which the natural oxide film is removed is supported in a predetermined position of the boat 217 together with the wafer 200 to be processed, and the bare wafer as the pseudo catalyst can be accommodated in the process chamber 201 by loading the boat 217 into the process chamber 201 in that state. Furthermore, in this case, it is desirable that the bare wafer as the pseudo catalyst and the wafer 200 to be processed be alternately charged on the boat 217 every other sheet, and the bare wafer be arranged directly above the base 200a by allowing the upper surface of the wafer 200 to be processed and the surface of the bare wafer as the pseudo catalyst to face each other. In this case, at step A, the F-containing radical can be efficiently generated by bringing the F-containing gas into contact with the bare wafer as the pseudo catalyst, and the F-containing radical efficiently generated in this way can be efficiently supplied to the base 200a.

The processing procedures and processing conditions in the selective growth at this time may be similar to the processing procedures and processing conditions of the aforementioned embodiments except that the bare wafer as the pseudo catalyst from which the natural oxide film is removed is set in the boat 217. In this case, at step A, an example of a reaction which goes ahead on the surface of the wafer 200 by supplying a $ClF_3$ gas as the F-containing gas in an atmosphere in which the bare wafer, i.e., Si, as the pseudo catalyst exists, will be described below. In various examples of reaction formulas described below, (s) indicates that the substance is a solid (solid phase), and (g) indicates that the substance is a gas (gas phase). Among various F-containing materials generated from the ClF$_3$ gas in an atmosphere in which Si exists, for example, F, ClF$_2$, ClF, SiF$_2$, SiF$_3$, and the like correspond to F-containing radicals.

$$Si(s)+ClF_3(g) \rightarrow SiF(s)+ClF_2(g)$$

$$SiF(s)+ClF_2(g) \rightarrow SiF_2(s)+ClF(g)$$

$$SiF_2(s)+ClF(g) \rightarrow SiF_3(s)+Cl(g)$$

$$ClF_3(g) \rightarrow ClF_2(g)+F(g)$$

Even in this case, the same effects as those of the aforementioned embodiments may be achieved. Furthermore, by supplying the F-containing gas in an atmosphere in which the pseudo catalyst exists at step A, it is possible to increase the amount of the F-containing radical generated by more promoting the generation of the F-containing radical in the process chamber 201 than in the case where the F-containing gas is supplied in an atmosphere in which the pseudo catalyst does not exist. As a result, at step A, by promoting the modification of the surface of the base 200a, it is possible to more reliably perform the selective formation of the SiN film on the surface of the base 200b. Moreover, by using the pseudo catalyst, it is possible to lower the processing temperature at step A, and to effectively suppress the etching of the surface of the base 200b or the etching damage to the surface of the base 200b at step A.

In addition, instead of the bare wafer, a plate made of Si (Si plate), a chip made of Si (Si chip), a piece made of Si (Si piece), a block made of Si (Si block), or the like may be used as the pseudo catalyst. Even when these are used the pseudo catalyst, it is necessary to remove the natural oxide film formed on their outermost surfaces and to create a state in which the Si material is exposed at the outermost surfaces, as the case of using the bare wafer as the pseudo catalyst.

Furthermore, before performing the selective growth, a Si film is formed (precoated) in advance on the surface of any member (the inner wall of the reaction tube 203, the surface of the boat 217, or the like) in the process chamber 201, and this Si film (precoated film) may also be used as the pseudo catalyst. The Si film as the precoated film may be formed, for example, using a silane-based gas such as a monosilane (SiH$_4$) gas or the like and by a CVD method. The Si film may be a Si film in an amorphous (non-crystalline) state, a Si film in a poly (polycrystalline) state, or a Si film in a mixed state of amorphous and polycrystal.

Examples of the processing conditions when forming the Si film may be described as follows:
  Supply flow rate of SiH$_4$ gas: 10 to 2,000 sccm
  Supply flow rate of N$_2$ gas (per each gas supply pipe): 0 to 10,000 sccm
  Supply time of gas: 10 to 400 minutes
  Processing temperature: 450 to 550 degrees C., or 450 to 530 degrees C. in some embodiments
  Processing pressure: 1 to 900 Pa.

In this case, at step A, the F-containing radical can be efficiently generated by bringing the F-containing gas into contact with the Si film (precoated film) as the pseudo catalyst, and the F-containing radical efficiently generated in this way can be efficiently supplied to the base 200a.

As the precoated film, a SiN film, a silicon carbide film (SiC film), a silicon carbonitride film (SiCN film), a silicon-rich SiN film (SiRN film), a silicon-rich SiC film (SiRC film), a silicon-rich SiCN film (SiRCN film), or the like, in addition to the Si film, may be used. That is, a Si-containing film containing C or N, in addition to Si, may be used as the precoated film. The SiN film, the SiC film, the SiCN film, the SiRN film, the SiRC film, and the SiRCN film as the precoated films may be formed, for example, using an aminosilane-based gas such as an ethylmethylaminosilane (SiH$_3$[N(CH$_3$)(C$_2$H$_5$)]) gas, a dimethylaminosilane (SiH$_3$[N(CH$_3$)$_2$)) gas, a diisopropylaminosilane (SiH$_3$[N(C$_3$H$_7$)$_2$]) gas, a disecondary butylaminosilane (SiH$_3$[H(C$_4$H$_9$)$_2$]) gas, or the like and by the CVD method. The processing conditions at this time may be similar to the processing conditions when forming the Si film as the precoated film described above. The aminosilane-based gas is a gas containing Si and an amino group, and may be a gas containing at least Si, N, and C as constituent elements.

Also, in these cases, at step A, the F-containing radical can be efficiently generated by bringing the F-containing gas into contact with the SiN film, the SiC film, the SiCN film, the SiRN film, the SiRC film, or the SiRCN film (precoated film) as the pseudo catalyst, and the F-containing radical efficiently generated in this way can be efficiently supplied to the base 200a.

The processing procedures and processing conditions in the selective growth when these precoated films used as the pseudo catalysts may be similar to the processing procedures and processing conditions of the aforementioned embodiments except that these films are precoated on the surface of any member in the process chamber 201. As described above, even when the precoated film is used as the pseudo catalyst, the same effects as those when the bare wafer is used as the pseudo catalyst may be achieved. The precoated film in this case may also be referred to as a pseudo catalyst film or a pseudo catalyst precoated film.

In addition, after the wafer 200 to be processed is accommodated in the process chamber 201 and before the selective growth is performed, a Si film is formed on the surface of the wafer 200, i.e., on the surface of the base 200a or 200b, and this Si film may also be used as the pseudo catalyst, i.e., the pseudo catalyst film. As the pseudo catalyst film, a SiN film, a SiC film, a SiCN film, a SiRN film, a SiRC film, a SiRCN film, or the like, in addition to the Si film, may be used. That is, a Si-containing film containing C or N, in addition to Si, may be used as the pseudo catalyst film. A gas and processing conditions used when forming the Si film, the SiN film, the SiC film, the SiCN film, the SiRN film, the SiRC film, the SiRCN film, or the like as the pseudo catalyst film may be similar to the gas and the processing conditions used when forming the precoated film described above.

In these cases, at step A, the F-containing radical can be efficiently generated by bringing the F-containing gas into contact with the pseudo catalyst film, and the F-containing radical efficiently generated in this way can be supplied to the base 200a. That is, the surface of the base 200a can be modified so as to be F-terminated. In addition, at this time, the pseudo catalyst film formed on the surface of the base 200b is etched and the adsorption site is exposed at the surface of the base 200b. At this time, the surface of the base 200b may also be slightly etched, but also in that case, the etching amount is small and the adsorption site on its surface is kept. The base 200a is formed of a SiO film, and has a strong Si—O bond so that the surface thereof is not etched, but appropriately F-terminated and appropriately modified.

The processing procedures and processing conditions in the selective growth in the case of using these pseudo catalyst films may be similar to the processing procedures and processing conditions of the aforementioned embodiments except that the pseudo catalyst film is formed on the surface of the wafer 200. As described above, even when the Si film, the SiN film, the SiC film, the SiCN film, the SiRN film, the SiRC film, the SiRCN film, or the like is used as the pseudo catalyst, the same effects as those when the bare wafer is used as the pseudo catalyst may be achieved.

Furthermore, as the pseudo catalyst, it is possible to use, for example, a gaseous pseudo catalyst, as well as the solid pseudo catalyst such as the bare wafer, the Si plate, the Si chip, the Si piece, the Si block, the Si-containing precoated film or the Si-containing pseudo catalyst film. As the gaseous pseudo catalyst, i.e., the pseudo catalyst gas, it is possible to use a gas for promoting the decomposition of the F-containing gas and generating the F-containing radical from the F-containing gas by bringing it into contact with the F-containing gas. As the pseudo catalyst gas, specifically, it may be possible to use, for example, at least one selected from the group of an oxygen ($O_2$) gas, a nitrous oxide ($N_2O$) gas, a nitrogen dioxide ($NO_2$) gas, a NO gas, a HF gas, an $NH_3$ gas, and a hydrogen ($H_2$) gas. The supply of these gases may be performed simultaneously with the supply of the F-containing gas into the process chamber 201 using, for example, the nozzles 249$a$ and 249$c$ or the like.

In this case, at step A, the F-containing gas is supplied in an atmosphere in which the pseudo catalyst gas exists by simultaneously supplying the F-containing gas and the pseudo catalyst gas into the process chamber 201. At this time, the F-containing gas can be brought into contact with the pseudo catalyst gas, whereby the F-containing radical can be efficiently generated and the F-containing radical efficiently generated in this way can be efficiently generated to the base 200$a$. As long as the F-containing gas and the pseudo catalyst gas are mixed in the process chamber 201, the F-containing gas and the pseudo catalyst gas may also be supplied into the process chamber 201 alternately or intermittently.

The processing procedures and processing conditions in the selective growth at this time may be similar to the processing procedures and processing conditions of the aforementioned embodiments except that the F-containing gas and the pseudo catalyst gas are supplied into the process chamber 201. As described above, even when the F-containing gas and the pseudo catalyst gas are supplied, the same effects as those when the bare wafer is used as the pseudo catalyst may be achieved. Furthermore, even when the gaseous pseudo catalyst is used, it is possible to lower the processing temperatures at step A and to effectively suppress the etching of the surface of the base 200$b$ or the etching damage to the surface of the base 200$b$ at step A, as the case of using the solid pseudo catalyst.

Furthermore, the term "catalyst" refers to a substance that does not change before and after a chemical reaction but which changes the speed of reaction. All of the aforementioned substances exemplified as the pseudo catalysts have a catalytic action of promoting the generation of F-containing radical, but some of these substances themselves change before and after a chemical reaction. For example, a NO gas has a catalytic action, but when reacting with the F-containing gas, a portion of the molecular structure may be decomposed so that the NO gas may change before and after the chemical reaction. As described above, even if the substance itself changes before and after the chemical reaction, the substance that changes the speed of the reaction will be referred to herein as a "pseudo catalyst."

In addition, for example, at step A, the generation of the F-containing radical from the F-containing gas may be promoted by activation (excitation) of the F-containing gas by plasma, heating, light irradiation, or the like. Even in these cases, the same effects as those of the aforementioned embodiments may be achieved. Furthermore, at step A, the generation of the F-containing radical in the process chamber 201 may be promoted by activating the F-containing gas by plasma, heating, light irradiation, or the like, compared with the case where the F-containing gas is not activated by these, making it possible to increase the amount of the F-containing radical to be generated. As a result, it is possible to promote the modification of the surface of the base 200$a$, and to more reliably perform the selective formation of the SiN film on the surface of the base 200$b$ at step A. Furthermore, by using the pseudo catalyst, it is also possible to lower the processing temperature at step A. Moreover, in the case of using plasma, it is desirable that the F-containing gas be activated by plasma in a remote plasma unit installed outside the process chamber 201 and then a method of supply into the process chamber 201, i.e., a remote plasma method, be employed in order to suppress plasma damage to the wafer 200 or any member in the process chamber 201.

Furthermore, in addition to the base 200$a$ including the SiO film and the base 200$b$ including the SiN film on the surface of the wafer 200, for example, a base including a conductive metal thin film such as a tungsten film (W film), a tungsten nitride film (WN film), a titanium nitride film (TiN film), or the like may be exposed. Also, instead of the base 200$b$ including the SiN film, the base including the metal thin film described above may be exposed. Even in these cases, the same effects as those of the aforementioned embodiments may be achieved. That is, it is possible to selectively form a film on the surface of the SiN film or the surface of the metal thin film described above while avoiding film formation on the SiO film.

Furthermore, for example, at step B, a step of supplying an $NH_3$ gas to the wafer 200 in the process chamber 201, i.e., the wafer 200 after selectively modifying the surface of the base 200$a$ among the bases 200$a$ and 200$b$ for a predetermined time ($NH_3$ preflow) may be performed before starting a cycle which non-simultaneously performs steps B1 and B2. Even in this case, the same effects as those of the aforementioned embodiments may be achieved because the F termination existing on the surface of the base 200$a$ is stably kept without being eliminated. In addition, it is possible to optimize the adsorption site on the surface of the base 200$b$ and to improve the quality of the SiN film formed on the base 200$b$.

Furthermore, for example, at step B, as the precursor gas, it is possible to use, in addition to the $SiCl_4$ gas, a metal halide gas such as the chlorosilane-based gas, the titanium tetrachloride ($TiCl_4$) gas, or the like described above. Moreover, for example, as the reaction gas, it may be possible to use, in addition to the N-containing gas such as the $NH_3$ gas, an O-containing gas such as an $O_2$ gas, an N- and C-containing gas such as a triethylamine (($C_2H_5$)$_3$N, abbreviation: TEA) gas or the like, a C-containing gas such as a propylene ($C_3H_6$) gas or the like, or a boron (B)-containing gas such as a tricloborane ($BCl_3$) gas or the like. Then, a film such as a silicon oxynitride film (SiON film), a silicon carbonitride film (SiCN film), a silicon oxycarbonitride film (SiOCN film), a silicon oxycarbide film (SiOC film), a silicon boronitride film (SiBN film), a silicon boron carbonitride film (SiBCN film), a titanium nitride film (TiN film), a titanate oxynitride film (TiON film), or the like may be formed on the surface of the base 200$b$ which is not modified among the bases 200$a$ and 200$b$ by the gas supply sequences illustrated below. The F termination formed on the surface of the base 200$a$ is very stable, and therefore, in these cases, when a gas containing a OH group such as water vapor ($H_2O$ gas), a hydrogen peroxide gas ($H_2O_2$ gas), or the like is not used as the film-forming gas, the same effects as those of the aforementioned embodiments may be achieved.

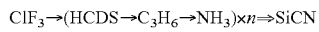

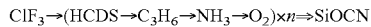

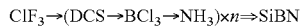

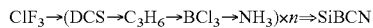

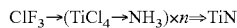

Recipes used in each processing may be prepared individually according to the processing contents and may be stored in the memory device 121c via a telecommunication line or the external memory device 123. Moreover, at the start of substrate processing, the CPU 121a may properly select an appropriate recipe from the recipes stored in the memory device 121c according to the processing contents. Thus, it is possible for a single substrate processing apparatus to form films of different kinds, composition ratios, qualities and thicknesses with enhanced reproducibility. In addition, it is possible to reduce an operator's burden and to quickly start each processing while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiments, there has been described an example in which films are formed using a batch-type substrate processing apparatus capable of processing a plurality of substrates at a time. The present disclosure is not limited to the aforementioned embodiments but may be appropriately applied to, e.g., a case where films are formed using a single-wafer-type substrate processing apparatus capable of processing a single substrate or several substrates at a time. In addition, in the aforementioned embodiments, there has been described an example in which films are formed using the substrate processing apparatus provided with a hot-wall-type process furnace. The present disclosure is not limited to the aforementioned embodiments but may be appropriately applied to a case where films are formed using a substrate processing apparatus provided with a cold-wall-type process furnace.

Even in the case of using these substrate processing apparatuses, each processing may be performed by the processing sequences and processing conditions similar to those of the aforementioned embodiments. Effects similar to those of the aforementioned embodiments above may be achieved.

The embodiments described above may be appropriately combined with one another. The processing procedures and processing conditions at this time may be similar to, for example, the processing procedures and processing conditions of the aforementioned embodiments.

Examples

In samples 1 to 6, a SiN film was formed on a surface of a base of a wafer using the substrate processing apparatus illustrated in FIG. 1 and by the same processing procedures and processing conditions as step B of the aforementioned embodiments. When preparing samples 1, 3, and 5, a wafer having a base formed by a SiN film was used, and when preparing samples 2, 4, and 6, a wafer having a base formed by a SiO film was used.

When preparing samples 1 and 2, step A was not performed before step B was performed. When preparing samples 3 and 4, step A was performed before step B was performed. When preparing samples 5 and 6, step A was performed in a state in which a bare wafer as a pseudo catalyst from which a natural oxide film was removed was accommodated in the process chamber before step B was performed. Furthermore, samples 1 and 2 were simultaneously prepared in the same atmosphere (in the same process chamber), samples 3 and 4 were simultaneously prepared in the same atmosphere, and samples 5 and 6 were simultaneously prepared in the same atmosphere. In preparing any sample, at step A, a $ClF_3$ gas was used as a F-containing gas. Other processing conditions were set to predetermined conditions which fall within the processing condition range described in the aforementioned embodiments and which were common to the respective samples.

After samples 1 to 6 were prepared, the film thickness of the SiN film formed on the surface of each base of the wafer was measured. The results are illustrated in FIG. 8. As illustrated in FIG. 8, it could be confirmed that in samples 1 and 2, the thicknesses of the SiN film formed on the surface of the base of the wafer are 71.2□ and 65.0□ in order, and sufficient selectivity is not obtained by not performing step A. On the other hand, it could be confirmed that in samples 3 and 4, the thicknesses of the SiN film formed on the surface of the base of the wafer are 56.6□ and 36.0□ in order, and high selectivity is obtained by performing step A. Moreover, it could be seen that in samples 5 and 6, the thicknesses of the SiN film formed on the surface of the base of the wafer are 42.4□ and 5.3□ in order, and at step A, a very high selectivity is obtained by supplying a F-containing gas in an atmosphere in which a pseudo catalyst exists.

According to the present disclosure in some embodiments, it is possible to simplify a process of manufacturing a semiconductor device.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:
1. A method of manufacturing a semiconductor device, comprising:
(a) modifying a surface of one base among a first base and a second base to be F-terminated by supplying a fluorine-containing radical generated from a fluorine- containing gas to a substrate where the first base and the second base are exposed at a surface of the substrate; and (b) forming a film on a surface of the other base, which is different from the one base, among the first base and the second base by supplying a film-forming gas to the substrate after modifying the surface of the one base, wherein in (a), the fluorine-containing radical is generated by supplying the fluorine-containing gas in an atmosphere in which a pseudo catalyst exists, and wherein the pseudo catalyst contains silicon whose outermost surface is not covered with a natural oxide film.

2. The method according to claim 1, wherein in (a), the surface of the one base is modified to be SiF-terminated.

3. The method according to claim 1, wherein in (a), the surface of the one base is modified without being etched.

4. The method according to claim 1, wherein in (a), the surface of the one base is modified while a modification of the surface of the other base is suppressed.

5. The method according to claim 1, wherein in (b), the film is formed on the surface of the other base without forming the film on the surface of the one base.

6. The method according to claim 1, wherein the pseudo catalyst contains silicon in which a silicon material is exposed at an outermost surface of the silicon.

7. The method according to claim 1, wherein the pseudo catalyst contains silicon from which a natural oxide film formed at an outermost surface of the silicon is removed.

8. The method according to claim 1, wherein the pseudo catalyst includes a reaction gas for promoting decomposition of the fluorine-containing gas.

9. The method according to claim 1, wherein the pseudo catalyst includes at least one selected from the group of an oxygen gas, a nitrous oxide gas, a nitrogen dioxide gas, a nitrogen monoxide gas, a hydrogen fluoride gas, an ammonia gas, and a hydrogen gas.

10. The method according to claim 1, wherein the first base includes an oxygen-containing film, and the second base includes an oxygen-free film.

11. The method according to claim 1, wherein the first base includes an oxide film, and the second base includes a nitride film.

12. The method according to claim 1, wherein the first base includes a film containing silicon and oxygen, and the second base includes a film containing silicon and nitrogen.

13. The method according to claim 1, wherein the one base is the first base, and the other base is the second base.

14. The method according to claim 1, wherein (a) and (b) are performed in a non-plasma atmosphere.

15. The method according to claim 1, wherein in (a), the fluorine-containing radical is generated by activating the fluorine-containing gas by plasma, heating, or light irradiation.

16. The method according to claim 1, further comprising:

(c) eliminating a F termination formed on the surface of the one base by bringing a substance, which reacts with fluorine, into contact with the surface of the substrate after the film is formed on the surface of the other base.

17. A substrate processing apparatus, comprising:

a process chamber in which a substrate is processed;

a fluorine-containing gas supply system configured to supply a fluorine-containing gas to the substrate in the process chamber;

a film-forming gas supply system configured to supply a film-forming gas to the substrate in the process chamber;

a heater configured to heat the substrate in the process chamber; and a controller configured to be able to control the fluorine-containing gas supply system, the film-forming gas supply system, and the heater so as to perform a process in the process chamber, the process comprising:

(a) modifying a surface of one base among a first base and a second base to be F-terminated by supplying a fluorine-containing radical generated from the fluorine-containing gas to the substrate where the first base and the second base are exposed at a surface of the substrate; and (b) forming a film on a surface of the other base, which is different from the one base, among the first base and the second base by supplying the film-forming gas to the substrate after modifying the surface of the one base, wherein in (a), the fluorine-containing radical is generated by supplying the fluorine-containing gas in an atmosphere in which a pseudo catalyst exists, and wherein the pseudo catalyst contains silicon whose outermost surface is not covered with a natural oxide film.

18. A non-transitory computer-readable recording medium storing a program that causes, by a computer, a substrate processing apparatus to perform a process in a process chamber of the substrate processing apparatus, the process comprising:

(a) modifying a surface of one base among a first base and a second base to be F-terminated by supplying a fluorine-containing radical generated from a fluorine-containing gas to a substrate where the first base and the second base are exposed at a surface of the substrate; and (b) forming a film on a surface of the other base, which is different from the one base, among the first base and the second base by supplying a film-forming gas to the substrate after modifying the surface of the one base, wherein in (a), the fluorine-containing radical is generated by supplying the fluorine-containing gas in an atmosphere in which a pseudo catalyst exists, and wherein the pseudo catalyst contains silicon whose outermost surface is not covered with a natural oxide film.

* * * * *